US009379263B2

(12) United States Patent
Rasal et al.

(10) Patent No.: US 9,379,263 B2
(45) Date of Patent: *Jun. 28, 2016

(54) DURABLE POLYOLEFIN ADHESIVE MATERIAL FOR SOLAR MODULES

(75) Inventors: Rahul M. Rasal, Saint Paul, MN (US); Jay M. Jennen, Forest Lake, MN (US); Jeffrey G. Linert, Woodbury, MN (US); Belma Erdogan-Haug, Saint Paul, MN (US); Robert S. Clough, Saint Paul, MN (US)

(73) Assignee: 3M INNOVATIVE PROPERTIES COMPANY, Saint Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/355,920

(22) PCT Filed: Aug. 9, 2012

(86) PCT No.: PCT/US2012/050106
§ 371 (c)(1),
(2), (4) Date: Aug. 21, 2014

(87) PCT Pub. No.: WO2013/066460
PCT Pub. Date: May 10, 2013

(65) Prior Publication Data
US 2015/0005451 A1 Jan. 1, 2015

Related U.S. Application Data

(60) Provisional application No. 61/555,892, filed on Nov. 4, 2011.

(51) Int. Cl.
C08L 23/26 (2006.01)
H01L 31/048 (2014.01)
H01L 31/0216 (2014.01)

(52) U.S. Cl.
CPC ............. H01L 31/0481 (2013.01); C08L 23/26 (2013.01); H01L 31/02168 (2013.01); C08L 2203/206 (2013.01); C08L 2205/025 (2013.01); C08L 2312/08 (2013.01); Y02E 10/50 (2013.01)

(58) Field of Classification Search
CPC ............ H01L 31/0481; H01L 31/02168; Y02E 10/50; C08L 23/26; C08L 2023/49; C08L 2203/206; C08L 2205/025; C08L 2312/08
See application file for complete search history.

(56) References Cited

U.S. PATENT DOCUMENTS

| | | | |
|---|---|---|---|
| 3,318,835 | A | 5/1967 | Hagemeyer, Jr. |
| 3,862,107 | A | 1/1975 | MacLeay |
| 4,129,531 | A | 12/1978 | Rauer |
| 4,409,345 | A | 10/1983 | Moteki |
| 4,412,042 | A | 10/1983 | Matsuura |
| 5,209,977 | A | 5/1993 | Heimberg |
| 5,248,349 | A | 9/1993 | Foote |
| 5,548,014 | A | 8/1996 | Tse |
| 6,093,757 | A | 7/2000 | Pern |
| 6,544,661 | B1 | 4/2003 | Lee |
| 6,559,230 | B2 | 5/2003 | Heck |
| 6,693,237 | B2 | 2/2004 | Zenko |
| 7,847,184 | B2 | 12/2010 | Hayes |
| 7,902,301 | B2 | 3/2011 | Kempe |
| 2007/0267059 | A1 | 11/2007 | Nishijima |
| 2008/0078455 | A1 | 4/2008 | Patterson |
| 2008/0115825 | A1 | 5/2008 | Patel |
| 2009/0032101 | A1 | 2/2009 | Kempe |
| 2010/0069538 | A1 | 3/2010 | Kempe |
| 2010/0249256 | A1 | 9/2010 | Moscardi |
| 2010/0298515 | A1 | 11/2010 | Marchand |
| 2011/0048536 | A1 | 3/2011 | Rivard |
| 2011/0168239 | A1 | 7/2011 | Weaver |

FOREIGN PATENT DOCUMENTS

| | | |
|---|---|---|
| EP | 1837372 | 9/2007 |
| EP | 2067175 | 6/2009 |
| JP | 2003-138034 | 5/2003 |
| WO | WO 02-31044 | 4/2002 |
| WO | WO 2012-024262 | 2/2012 |
| WO | WO 2013-066459 | 5/2013 |
| WO | WO 2013-077866 | 5/2013 |
| WO | WO 2013-077874 | 5/2013 |

OTHER PUBLICATIONS

English Language Abstract for JP 2003-138034 dated May 14, 2003.
International Search Report for PCT International Application No. PCT/US2012/50106, mailed on Oct. 12, 2012, 3 pages
Howick, C. J. "Plasticizers." *Plastic Additives*. Ed. Geoffrey Pritchard. London: Chapman & Hall, 1998. 499-504. Print.
Osterwald, C. R. et al. 2009. *Prog. Photovolt: Res. Appl.* 17:11-33. "History of Accelerated and Qualification Testing of Terrestrial Photovoltaic Modules: A Literature Review".

*Primary Examiner* — Nathan M Nutter
(74) *Attorney, Agent, or Firm* — 3M Innovative Properties Company; Carlos M. Téllez

(57) ABSTRACT

This disclosure generally relates to films capable of use in electronic device modules and to electronic device modules including such films. The disclosure also generally relates to materials for use in such films.

19 Claims, 1 Drawing Sheet

DURABLE POLYOLEFIN ADHESIVE MATERIAL FOR SOLAR MODULES

CROSS REFERENCE TO RELATED APPLICATIONS

This application is a national stage filing under 35 U.S.C. 371 of International Application No. PCT/US2012/050106, filed Aug. 9, 2012, which claims priority to U.S. Provisional Application No. 61/555,892, filed Nov. 4, 2011. The disclosures of both applications are incorporated by reference in their entirety herein.

FIELD OF THE INVENTION

This disclosure generally relates to films capable of use in a photovoltaic solar module and to photovoltaic solar modules including such films. The disclosure also generally relates to materials for use in such films.

BACKGROUND

Three basic constructions of photovoltaic solar modules are commercially available. The first construction of solar module 10 is shown in FIG. 1 and includes a photovoltaic cell 20 embedded in encapsulant 30. Two panels of glass (or other suitable material) 40, 50 are positioned adjacent to the frontside and backside of the encapsulant. The encapsulant protects the fragile solar cells and adheres them to the frontside and backside glass layers. Typically, this construction of solar module includes encapsulant on both sides of the solar cell. This can be accomplished, for example, by including a frontside layer of encapsulant (positioned to face the sun) and a backside layer of encapsulant (positioned furthest from the sun). Front side encapsulant layers are preferably highly transmissive while backside encapsulant layers need not have the same level of transmissivity. This construction of photovoltaic solar module is generally described in, for example, U.S. Patent Publication No. 2008/0078445.

The second construction of solar module 60 is shown in FIG. 2 and includes a photovoltaic cell 70 positioned between a single encapsulant layer 80 and a backing material 90 (typically glass). Solar panel 60 also includes a protective layer 100 adjacent to encapsulant layer 80. As shown in FIG. 2, this solar panel design includes a frontside encapsulant and no backside encapsulant. This construction of photovoltaic solar module is generally described in, for example, This construction of a photovoltaic solar module is generally described in, for example, U.S. Patent Publication No. 2008/0078445.

The third construction of solar module 110 is shown in FIG. 3 and includes a photovoltaic cell 120 positioned between a single encapsulant layer 130 and a protective layer 150. Solar panel 110 also includes a backing layer 140 (typically glass) adjacent to encapsulant layer 130. As shown in FIG. 3, this solar panel design includes a backside encapsulant and no frontside encapsulant. This construction of photovoltaic solar module is generally described in, for example, U.S. Pat. No. 5,248,349.

SUMMARY

Some exemplary encapsulant layers include ethylene vinyl acetate (EVA) and a cross-linking agent (e.g. peroxide). The inventors of the present disclosure recognized that although crosslinked EVA films often have high strength, they can suffer from a relatively high water vapor transmission rate, yellowing, and possible corrosion due to release of acetic acid.

Some exemplary encapsulant layers include resins that are tacky. Such tackiness is a disadvantage because it may cause "blockiness" in handling a roll good or in general film storage or handling. Consequently, the inventors of the present application recognized that it is desirable to create films or to use resins that are less tacky.

Solar panel operating temperatures have been measured as high as 110° C. The inventors of the present application recognized that encapsulant films including thermoplastic adhesives can soften at this elevated temperature, causing creep in the panel and possibly resulting in shorting of the photovoltaic cell. These encapsulant films may also be susceptible to UV-induced breakdown, necessitating inclusion of large amounts of UV absorber, which limits the amount of incident light that can be used to power the solar cell. The inventors of the present disclosure also recognized that thermoset adhesives can suffer from slower extrusion processing speeds, causing increased manufacturing cost.

Consequently, there is a need for encapsulant films and materials that minimize the incidence of one or more of creep, shrinkage, light transmission, yellowing, corrosion, and delamination while maintaining or improving film processability and manufacturing cost. The inventors of the present disclosure have discovered encapsulant films, materials for use in such films, and solar modules including such films and materials that provide at least one of improved performance, cost, and processability.

In one exemplary embodiment, a film capable of use in a photovoltaic solar module includes: a first low crystalline ethylene/α-olefin copolymer with a DSC peak melting point less than or equal to 50° C.; a second low crystalline ethylene/α-olefin copolymer with a DSC peak melting point greater than 50° C.; a silane; and one or more cross-linking agents.

In another exemplary embodiment, a film capable of use in a photovoltaic solar module includes a first polyolefin with a DSC peak melting point less than or equal to 50° C.; a second polyolefin with a DSC peak melting point greater than 50° C.; a silane; and one or more cross-linking agents; wherein the % T averages at least 90% over a wavelength range of 400-1100 nm after exposure to the "85/85 durability test" for 1000 hrs.

In some embodiments, the polyolefin is an ethylene/α-olefin copolymer. In some embodiments, the α-olefin moiety of the ethylene/α-olefin copolymer includes four or more carbons. In some embodiments, the ethylene/α-olefin copolymer is a low crystalline ethylene/α-olefin copolymer. In some embodiments, the low crystalline ethylene/α-olefin copolymer has a DSC peak melting point of less than or equal to 50° C. In some embodiments, the low crystalline ethylene/α-olefin copolymer is a butene α-olefin. In some embodiments, the film is greater than 70% by weight of low crystalline ethylene/α-olefin copolymer. In some embodiments, the silane is an unsaturated alkoxysilane. In some embodiments, the unsaturated alkoxysilane is an acrylic alkoxysilane. In some embodiments, the one or more cross-linking agents are one of a thermal curative and a photo-curative. In some embodiments, the thermal curative is a peroxide. In some embodiments, the film further includes a coagent. In some embodiments, the film further includes an additional resin. In some embodiments, the additional resin is an additional low crystalline ethylene/α-olefin copolymer. In some embodiments, the film further includes a hindered amine light stabilizer (HALS) with a ultraviolet cutoff of 310 nm. In some embodiments, the film has an average % transmittance of the film is at least 90% over a wavelength range of 400-1100 nm after exposure to an 85/85 durability test for 1000 hrs. In some embodiments, a machine direction shrinkage measurement is less than 10%. In some embodiments, a gel fraction of the film is less than 20%. In some embodiments, a gel fraction of the film is less than 5%. In some embodiments, the film includes multiple layers. In some embodiments, the film is in a solar cell module.

BRIEF DESCRIPTION OF THE DRAWINGS

The present disclosure may be more completely understood in consideration of the following detailed description of various embodiments of the disclosure in connection with the accompanying drawings, in which.

The figures are not necessarily to scale. It will be understood that the use of a number to refer to a component in a given figure is not intended to limit the component in another figure labeled with the same number.

DETAILED DESCRIPTION

Figure 1:
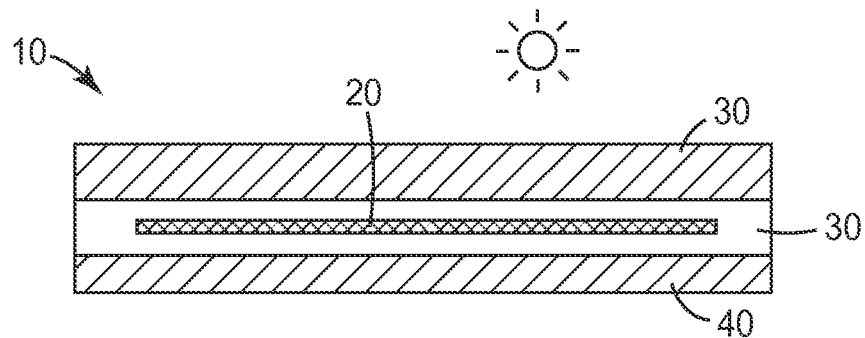
FIG. 1 is a cross-sectional view of one type of prior art photovoltaic solar module.
Figure 2:
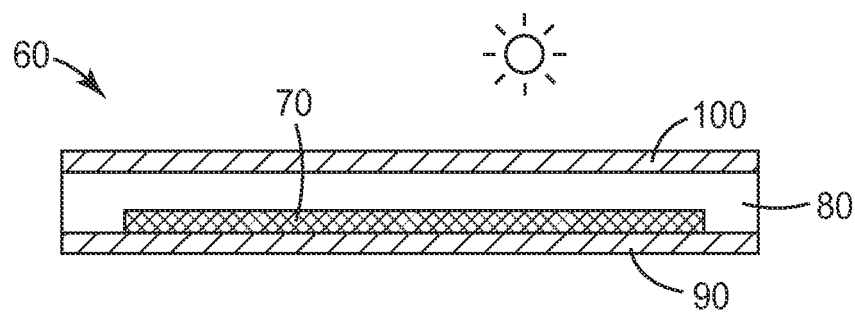
FIG. 2 is a cross-sectional view of one type of prior art photovoltaic solar module.
Figure 3:
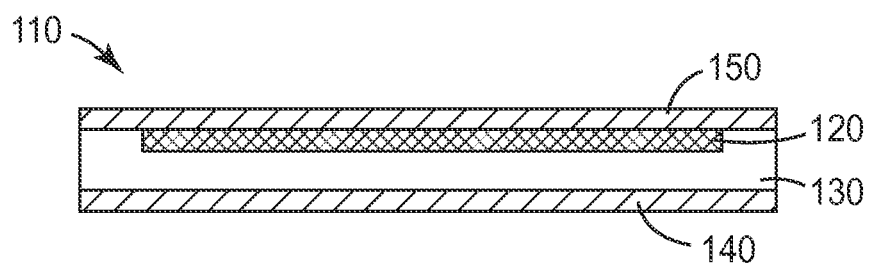
FIG. 3 is a cross-sectional view of one type of prior art photovoltaic solar module.

In the following detailed description, reference may be made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

The present application generally relates to films capable of use in solar modules. The films of the present disclosure can be used in any type of photovoltaic solar module, including, for example, any of the solar modules described in the background. In one exemplary embodiment, a film capable of use in a photovoltaic solar module includes a first low crystalline ethylene/α-olefin copolymer with a DSC peak melting point less than or equal to 50° C.; a second low crystalline ethylene/α-olefin copolymer with a DSC peak melting point greater than 50° C.; a silane; and one or more cross-linking agents. In another exemplary embodiment, a film capable of use in a photovoltaic solar module includes a first polyolefin with a DSC peak melting point less than or equal to 50° C.; a second polyolefin with a DSC peak melting point greater than 50° C.; a silane; and one or more cross-linking agents; wherein the % T averages at least 90% over a wavelength range of 400-1100 nm after exposure to the "85/85 durability test" for 1000 hrs.

Polyolefin

In some embodiments, the polyolefin is one or more of EVA, high density polyethylene, ionomers, polystyrene, and polyvinyl butyral.

In some embodiments, the polyolefin is an ethylene/α-olefin copolymer. As used herein, the term "ethylene/α-olefin copolymer" refers to polymers comprising a class of hydrocarbons manufactured by the catalytic oligomerization (i.e., polymerization to low-molecular-weight products) of ethylene and linear α-olefin monomers. The ethylene/α-olefin copolymers may be made, for example, with a single site catalyst such as a metallocene catalyst or multi-site catalysts such as Ziegler-Natta and Phillips catalysts. The linear α-olefin monomers typically are 1-butene or 1-octene but may range from C3 to C20 linear, branched or cyclic α-olefin. The α-olefin may be branched but only if the branch is at least alpha to the double bond, such as 3-methyl-1-pentene. Examples of C3-C20 α-olefins include propylene, 1-butene, 4-methyl-1-butene, 1-hexene, 1-octene, 1-dodecene, 1-tetradecene, 1-hexadecene and 1-octadecene. The α-olefins can also contain a cyclic structure such as cyclohexane or cyclopentane, resulting in an α-olefin such as 3-cyclohexyl-1 propene (allyl cyclohexane) and vinyl cyclohexane. Although not α-olefins in the classical sense of the term, for purposes of this disclosure certain cyclic olefins, such as norbornene and related olefins, are α-olefins and can be used. Similarly, styrene and its related olefins (for example, α-methyl styrene) are α-olefins for the purposes of this disclosure. Acrylic and methacrylic acid and their respective ionomers, and acrylates and methacrylates, however are not α-olefins for the purposes of this disclosure. Illustrative ethylene/α-olefin copolymers include ethylene/1-butene, ethylene/1-octene, ethylene/1-butene/1-octene, ethylene/styrene. The polymers can be block or random. Exemplary commercially available low crystalline ethylene/α-olefin copolymers include resins sold under the tradenames "ENGAGE" ethylene/1-butene and ethylene/1-octene copolymers and "FLEXOMER" ethylene/1-hexene copolymer, available from Dow Chemical Co., and homogeneously branched, substantially linear ethylene/α-olefin copolymers such as "TAFMER", available from Mitsui Petrochemicals Company Limited, and "EXACT", available from ExxonMobil Corp. As used herein, the term "copolymer" refers to polymers made from at least 2 monomers.

In some of these embodiments, the α-olefin moiety of the ethylene/α-olefin copolymer includes four or more carbons. In some embodiments, the ethylene/α-olefin copolymer is a low crystalline ethylene/α-olefin copolymer. As used herein, the term "low crystalline" means crystallinity (according to method disclosed in ASTM F2625-07) of less than 50% by weight. In some embodiments, the low crystalline ethylene/α-olefin copolymer is a butene α-olefin. In some embodiments the α-olefin of the low crystalline ethylene/α-olefin copolymer has 4 or more carbons.

In some embodiments, the film includes a first low crystalline ethylene/α-olefin copolymer having a DSC peak melting point of less than or equal to 50° C. and a second low crystalline ethylene/α-olefin copolymer having a DSC peak melting point of greater than 50° C. As used herein, the term "DSC peak melting point" means a melting point determined by DSC (10°/min) under nitrogen purge as the peak with the largest area under the DSC curve.

In some embodiments, the film includes greater than 35% by weight low crystalline ethylene/α-olefin copolymer. In some embodiments including a first low crystalline ethylene/α-olefin copolymer and a second low crystalline ethylene/α-olefin copolymer, the total low crystalline ethylene/α-olefin copolymer content (i.e., including both first and second low crystalline ethylene/α-olefin copolymer) is greater than 35% by weight low crystalline ethylene/α-olefin copolymer. In some embodiments, the film is greater than 50% by weight low crystalline ethylene/α-olefin copolymer. In some embodiments including a first low crystalline ethylene/α-olefin copolymer and a second low crystalline ethylene/α-olefin copolymer, the total low crystalline ethylene/α-olefin copolymer content (i.e., including both first and second low crystalline ethylene/α-olefin copolymer) is greater than 50% by weight low crystalline ethylene/α-olefin copolymer. In some embodiments, the film is greater than 70% by weight low crystalline ethylene/α-olefin copolymer. In some embodiments including a first low crystalline ethylene/α-olefin copolymer and a second low crystalline ethylene/α- olefin copolymer, the total low crystalline ethylene/α-olefin copolymer content (i.e., including both first and second low crystalline ethylene/α-olefin copolymer) is greater than 70% by weight low crystalline ethylene/α-olefin copolymer.

In some embodiments, the film includes additional polyolefin resins. Exemplary additional resins include, for example, low crystalline ethylene/α-olefin copolymer, HDPE, and polystyrene. In embodiments where the additional resin is a low crystalline ethylene/α-olefin copolymer, the two copolymers could, for example, have respective DSC peak melting points of, for example, less than 50° C. and greater than 50° C. In alternative exemplary embodiments, one low crystalline ethylene/α-olefin copolymer could have a DSC peak melting point of less than 50° C. while the other low crystalline ethylene/α-olefin copolymer could have a DSC peak melting point of greater than 55° C., or greater than 60° C., or greater than 65° C., or greater than 70° C., or greater than 75° C. In another exemplary embodiment one low crystalline ethylene/α-olefin copolymer could have a DSC peak melting point of greater than 50° C. while the other low crystalline ethylene/α-olefin copolymer could have a DSC peak melting point of less than 45° C., or less than 40° C., or less than 35° C. In an alternative exemplary embodiment, one of the two low crystalline ethylene/α-olefin copolymers is ethylene/butene copolymer and the other is an ethylene/octene copolymer.

Silane

Exemplary silanes for use in the films of the present disclosure include, for example, silanes that include an ethylenically unsaturated hydrocarbyl group (such as, for example, vinyl, allyl, isopropenyl, butenyl, cyclohexenyl or γ-(meth) acryloxy allyl group) and a hydrolysable group (such as, for example, methoxy, ethoxy, formyloxy, acetoxy, propionyloxy, alkyl, arylamino, hydrocarbonyloxy or hydrocarbylamino groups). In some exemplary embodiments, the silane is an unsaturated alkoxysilane. In some exemplary embodiments, the unsaturated alkoxysilane is an acrylic silane. Some examples include vinyl trimethoxysilane, vinyl triethoxysilane, and 3-(meth)acryloxypropyl trimethoxysilane. Commercially available examples include "SILQUEST A174 and SILQUEST A171".

The amount of silane is typically at least about 0.05%, for example 0.1%, for example 0.5%, for example 1.0%, for example 2.0%, for example 10.0%, or even for example 10.0%.

Cross-Linking Agents

The films of the present disclosure include one or more cross-linking agents. Exemplary cross-linking agents include, for example, thermal and photo cross-linking agents. Some exemplary thermal cross-linking agents include, for example, peroxides. Some exemplary peroxides include, for example, diacyl peroxides (such as, for example, dilauryl peroxide and didecanoyl peroxide), alkyl peresters (such as, for example, tert-butyl peroxy-2-ethylhexanoate), perketals (such as, for example, 1,1-di(tert-butylperoxy)-3,3,5-trimethylcyclohexane or 1,1-di(tert-butylperoxy)cyclohexane), dialkyl peroxides (such as, for example, tert-butyl cumyl peroxide, di(tert-butyl) peroxide and dicumyl peroxide), C-radical donors (such as, for example, 3,4-dimethyl-3,4-diphenylhexane and 2,3-dimethyl-2,3-diphenylbutane), and azo compounds (such as, for example, 2,2'-azodi (2-acetoxypropane)). Additional exemplary azo compounds include those described in U.S. Pat. Nos. 3,862,107 and 4,129,531. Some exemplary commercially available peroxides include, for example, "LUPEROX TBEC", "LUPEROX 231", and "LUPEROX P. Mixtures of two or more cross-linking agents may be used.

The amount of cross-linking agent varies, but the minimum amount is that sufficient to afford the desired range of crosslinking. In some embodiments, the film includes at least about 0.05%. In some embodiments, the film includes at least about 0.5%. In some embodiments, the film includes at least about 1.0%. In some embodiments, the film includes at least about 2.0%. In some embodiments, the film includes at least about 5.0%.

Plasticizer(s)

Preferred plasticizers for use in the films described herein are those that are non fugitive and/or crosslink the polymers in the film. Plasticizers used in the films described herein may improve extrusion processing speed and reduce film shrinkage while increasing storage modulus (creep resistance) at temperatures between about 100° C. and 200° C. Preferably, such plasticizers also are not substantially tacky at normal handling or storage temperatures. In some exemplary embodiments, the plasticizer(s) used in the films are liquids at 20° C. In some exemplary embodiments, the plasticizer does not act as a tackifier.

In some exemplary embodiments, the plasticizer is nonpolar. As used herein, the term "nonpolar plasticizer" means a nonpolar additive that increases the plasticity, fluidity or flowability of a low crystalline ethylene/α-olefin polymer and has a MW of less than 10,000 as determined by ASTM D6474. As used herein, nonpolar plasticizers do not include, for example, common polar polyvinylchloride (PVC) plasticizers such as phthalic acid diesters (e.g. diethylphthlate, dibutylphthlate, dioctylphthlate) or other polar ester plasticizers such as trimellitates, adipates, sebacates, maleates, citrates or benzoates. Examples of non-polar plasticizers include, for example, ethylene/α-olefin copolymers and C4-C10 polyolefin homopolymers. In some exemplary embodiments, the nonpolar plasticizer may be selected from the group consisting of ethylene/α-olefin copolymers and C4-C10 polyolefin homopolymers.

Exemplary commercially available nonpolar plasticizers include those under the tradename "SPECTRASYN" commercially available from ExxonMobil Chemical, Baton Rouge, La., "KAYDOL" white mineral oil commercially available from Sonneborn Refined Products B.V., Amsterdam, the Netherlands, "INDOPOL" polybutenes commercially available from Ineos Oligomers, League City, Tex. and "TRILENE" ethylene propylene (EP) or EPDM copolymers commercially available from Lion Copolymer, Baton Rouge, La.

The nonpolar plasticizer may have a Tg of less than −50° C., for example less than −55° C., for example less than −65° C., for example less than −70° C., or even for example less than −75° C. The plasticizer may have a DSC peak melting point of less than 80° C., for example less than 60° C., for example less than 40° C. or even for example less than 20° C. In one embodiment the plasticizer is a liquid at 20° C.

In some exemplary embodiments, conventional plasticizers such as are commonly used for poly(vinyl chloride) are substantially absent. As used in this paragraph, the term "substantially absent," means that these compounds are not added deliberately to the compositions and—if present—comprise less than 0.5 wt % of the total film composition.

In particular, plasticizers such as phthalates, adipates, trimellitate esters, polyesters, and other functionalized plasticizers as disclosed in, for example, U.S. Pat. No. 3,318,835; U.S. Pat. No. 4,409,345; WO 02/31044 A1; and PLASTICS ADDITIVES 499-504 (Geoffrey Pritchard, ed., Chapman & Hall 1998) are substantially absent.

The amount of plasticizer is typically at least about 0.5%. In some embodiments, the amount of plasticizer is at least about 1.0%. In some embodiments, the amount of plasticizer is at least about 2.0%. In some embodiments, the amount of plasticizer is at least about 5.0%. In some embodiments, the amount of plasticizer is at least about 10.0%. In some embodiments, the amount of plasticizer is at least about 20.0%.

Additives

In some exemplary embodiments, the films of the present disclosure include a coagent. Exemplary coagents include, for example, free radical crosslinking coagents (promoters or co-initiators). Examples of such coagents include multifunctional vinyl monomers and polymers, triallyl isocyanuarate, trimethylolpropane trimethylacrylate, divinyl benzene, acrylates and methacrylates of polyols, allyl alcohol derivatives, and low molecular weight polybutadiene. Sulfur crosslinking promoters include benzothiazyl disulfide, 2-mercaptobenothiazole and tetramethylthiuram tetrasulfide.

In some exemplary embodiments, the film further includes one or more UV absorbers. UV absorbers absorb light and can thereby protect polymeric materials and/or solar cells. Some exemplary UV absorbers include, for example, triazines, benzotriazoles, hydroxybenzophenones, hydroxyphenyltriazines, esters of benzoic acids, and mixtures of two or more thereof. In some exemplary embodiments, the films of the present disclosure include 0.01% UV absorber. In some exemplary embodiments, the films of the present disclosure include 0.1% UV absorber. In some exemplary embodiments, the films of the present disclosure include 0.5% UV absorber. In some exemplary embodiments, the films of the present disclosure include 1% UV absorber.

Films including UV absorbers have "UV cutoffs." As used herein, the term "UV cutoff" refers to the wavelength transmission of a film and means that the film will block substantially all UV light below the specified wavelength threshold. In some embodiments, the films of the present disclosure have a "UV cutoff" of 310, 350, and 380 nm, respectively. Such films can, for example, include less than 0.5% of "TINUVIN 622" HALS, "CHIMASSORB 81" UV absorber, or "TINUVIN 460" UV absorber, respectively.

In some exemplary embodiments, the film includes one or more hindered amine light stabilizer ("HALS"). HALS are light stabilizers rather than absorbers and scavenges radicals by production of nitroxyl radicals. In some embodiments, inclusion of a HALS instead of a UV absorber may permit entry of more light energy into a solar cell. Some exemplary HALS include, for example, cyclic amines, secondary, tertiary, acetylated, N-hydrocarbyloxy substituted, hydroxy substituted N-hydrocarbyloxy substituted, or other substituted cyclic amines which are further characterized by a degree of steric hindrance, generally as a result of substitution of an aliphatic group or groups on the carbon atoms adjacent to the amine function.

In some exemplary embodiments, the films of the present disclosure include 0.01% HALS. In some exemplary embodiments, the films of the present disclosure include 0.1% HALS. In some exemplary embodiments, the films of the present disclosure include 0.5% HALS. In some exemplary embodiments, the films of the present disclosure include 1% HALS.

Other additives include, for example, pigments such as carbon black and titanium dioxide; inorganic fillers such as talc, fumed silica, precipitated silica, barium sulfate and calcium carbonate; crosslinkers; anti-oxidants; scorch inhibitors; flame retardants; and catalysts for crosslinking such as organo tin compounds, for example di-n-butyl tin dilaurate. Other suitable catalysts include, for example titanium compounds and metal alkoxides, for example aluminum isopropoxide and zirconium isopropoxide.

The films of the present disclosure can be manufactured using known techniques in the art of film forming, including coating and curing on a release liner and extrusion coating. In some embodiments, the films can be used as an adhesive and may be exposed to further processing, e.g. heat and pressure. In some embodiments, the films are extruded. In some exemplary embodiments, the films of the present disclosure are delivered in film form. In some exemplary embodiments, the films of the present disclosure include a standard matte finish. In some exemplary embodiments, the films of the present disclosure are provided on a release liner.

In some embodiments, the films include multiple layers. In one exemplary implementation, a film of the present disclosure includes three or more layers. In one exemplary implementation of this, the cross-linking agent(s), silane, and/or polyolefin are in different layers. For example, the cross-linking agent(s) could be substantially or entirely in a center layer and the polyolefin and silane could be in the outer layers. In some embodiments, the films of the present disclosure can be used as a flexible polyolefin backsheet and/or frontsheet.

The films of the present disclosure may be used in a solar module. The solar module may be of any type known in the art. In some embodiments, the films or compositions described herein can be used as an adhesive for a solar module. In such uses, the films or compositions may be referred to as an "assembly adhesive," since they are used to assemble and hold together at least two elements of the solar module.

In some exemplary embodiments, for example, those where the film is laminated onto a solar cell, a low gel content may be preferred because a film with low gel content provides better adhesion and flexibility until cured at higher temperature to a higher gel content. In some exemplary embodiments, the gel fraction of the uncured film is less than 20% as measured by ASTM D2765-11. In some exemplary embodiments, the gel fraction of the uncured film is less than 10% as measured by ASTM D2765-11. In some exemplary embodiments, the gel fraction of the uncured film is less than 5% as measured by ASTM D2765-11. In some exemplary embodiments, the gel content after cross-linking is at least 40% when measured according to ASTM D2765-11. In some exemplary embodiments, the gel content after cross-linking is at least 50% when measured according to ASTM D2765-11. In some exemplary embodiments, the gel content after cross-linking is at least 60% when measured according to ASTM D2765-11. In some exemplary embodiments, the gel content after cross-linking is at least 70% when measured according to ASTM D2765-11.

The films of the present disclosure have an average % transmittance of at least 90% over a wavelength range of 400-1100 nm. This permits use of the films and compositions of the present disclosure as frontside encapsulant films. In some embodiments, the films of the present disclosure have an average % transmittance of the film is at least 90% over a wavelength range of 400-1100 nm after exposure to an 85/85 durability test for 1000 hrs. In some embodiments, a machine direction shrinkage measurement of the film is less than a machine direction shrinkage measurement of a film not including plasticizer. In some embodiments, a storage modulii measurement of the film at 100° C. is greater than storage modulii measurement at 100° C. of a film not including the plasticizer. In some embodiments, a storage modulii measurement of the film at 150° C. is greater than storage modulii measurement at 150° C. of a film not including the plasticizer.

The encapsulant films and materials of the present disclosure perform at least some of the following advantages over currently available encapsulant films: minimization of the incidence of creep, shrinkage, yellowing, corrosion, and delamination while maintaining or improving light transmission, film processability, and manufacturing cost. Additional advantages and embodiments of this disclosure are further illustrated by the following examples, but the particular materials and amounts thereof recited in these examples, as well as other conditions and details, should not be construed to unduly limit this disclosure. In these examples, all percentages, proportions and ratios are by weight unless otherwise indicated.

EXAMPLES

Comparative Examples 1 & 2 (Referred to Herein as "CE1" and "CE2") and Examples 1-3 (Referred to Herein as "EX1," "EX2," and "EX3")

The ingredients listed in Table 1 were pre-mixed and then allowed to soak for 24 hrs at room temperature. The resulting mixture was then processed in a Brabender (Model EPL V5502 from C.W. Brabender Instruments, Inc.) for 10 min at 200° C. and pressed to a thickness of 18 mil using a Carver Hydraulic press model 3925.

TABLE 1

Formulations

|  | CE1 | CE2 | EX1 | EX2 | EX3 |
|---|---|---|---|---|---|
| "EXACT 9361" | 100 | 0 | 25 | 50 | 75 |
| "EXACT 8230" | 0 | 100 | 75 | 50 | 25 |
| "LUPEROX TBEC" | 1 | 1 | 1 | 1 | 1 |
| "TAICROS" | 0.8 | 0.8 | 0.8 | 0.8 | 0.8 |
| "SILQUEST A174" | 0.8 | 0.8 | 0.8 | 0.8 | 0.8 |
| "CHIMASSORB 81" | 0.3 | 0.3 | 0.3 | 0.3 | 0.3 |

NOTE:
Total copolymer(s) add to 100 and all other ingredients were based on part per hundred (pph) copolymer Tackiness Two identical 18 mil thick films (e.g., two CE1 films, two CE2 films, two EX1 films, two EX2 films, and two EX3 films) were pressed together by hand with light pressure to determine whether they stick to one another. If the films stuck together, the film type was considered "tacky." Comparative Example 1 (CE1) was tacky while all of the other examples (CE2, EX1, EX2, and EX3) were not tacky.

Aged Adhesion Test

Both sides of a 6 inch×6 inch square of float glass was cleaned with isopropanol and dried. The square float of glass had a tin side (having a hazy blue glow under UV light) and a non-tin side. A 6 square inch by 18 mil thick film sample (CE1, CE2, EX1, EX2, and EX3) was cut from the patties formed as described above. A 0.75 inch×6 inch piece of release liner (a 2 mil polyester release liner sold by Mitsubishi) was placed between the glass and the encapsulant on one edge to aid as a "starter" tab to grab on to. A 6 inch×6 inch piece of solar backsheet (commercially available under the trade designation "3M SCOTCHSHIELD 17" from 3M, St. Paul, Minn.) was cut and placed with the smooth EVA side on the film sample. The construction was then laminated at 150° C. for 15 min in a Photovoltaic Module Laminator LM-50 X 50-S sold by NPC Group.

The samples were placed in a preheated and prehumidifed "CASCADE SE-1000-6-6" environmental chamber (commercially available from Thermotron, Holland, Mich.) and taken out after 120 hours.

The samples were then cut into half inch wide strips. A 90 degree peel test was then performed, according to ASTM D6862-04, at a pulling rate of 6 inch per minute using an "MTS INSIGHT," 10 kN extended length model, commercially available from MTS Systems Corporation, Eden Prarie, Minn. Replicates were performed and an average adhesion value was calculated. The results are provided in Table 2.

TABLE 2

Aged Adhesion Test Results

| Example | Aged Adhesion Test (N/cm) |
|---|---|
| CE1 | 72 |
| CE2 | 97 |
| EX1 | >120 |
| EX2 | >120 |
| EX3 | >120 |

As used in Table 2, numerical values followed by a greater than sign ">" indicates that there was tensile elongation failure of the backsheet at that numerical value but that adhesion of the encapsulant to the glass remained intact at that numerical level. Thus, one can conclude that the aged adhesion test results would be at least as high as the numerical value following the greater than sign, and likely higher than that numerical value. In contrast, a single number (e.g., 72 and 97 for CE1 and CE2) indicates that adhesion failed between the glass and encapsulant at that exact numerical value. Consequently, Table 2 shows that the exemplary films and compositions of the present disclosure exhibit enhanced adhesion as compared to the prior art films and compositions.

All references mentioned herein are incorporated by reference.

Unless otherwise indicated, all numbers expressing feature sizes, amounts, and physical properties used in the present disclosure and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this disclosure and the appended claims, the term "or" is generally employed in its sense including "and/or" unless the content clearly dictates otherwise.

Various embodiments and implementation of the present disclosure are disclosed. The disclosed embodiments are presented for purposes of illustration and not limitation. The implementations described above and other implementations are within the scope of the following claims. One skilled in the art will appreciate that the present disclosure can be practiced with embodiments and implementations other than those disclosed. Those having skill in the art will appreciate that many changes may be made to the details of the above-described embodiments and implementations without departing from the underlying principles thereof. It should be understood that this disclosure is not intended to be unduly limited by the illustrative embodiments and examples set forth herein and that such examples and embodiments are presented by way of example only with the scope of the disclosure intended to be limited only by the claims set forth herein as follows. Further, various modifications and alterations of the present disclosure will become apparent to those skilled in the art without departing from the spirit and scope of the present disclosure. The scope of the present application should, therefore, be determined only by the following claims.

What is claimed is:

1. A film capable of use in a photovoltaic solar module, comprising:
    a first low crystalline ethylene/α-olefin copolymer with a DSC peak melting point less than or equal to 50° C.;
    a second low crystalline ethylene/α-olefin copolymer with a DSC peak melting point greater than 50° C.;
    a silane; and
    one or more cross-linking agents.

2. The film of claim 1, wherein the silane is an unsaturated alkoxysilane.

3. The film of claim 1, wherein the one or more cross-linking agents are one of a thermal curative and a photo-curative.

4. The film of claim 1, wherein the α-olefin of one of the two low crystalline ethylene/α-olefin copolymers is a butene α-olefin.

5. The film of claim 1, further comprising a coagent.

6. The film of claim 1, further comprising an additional resin.

7. The film of claim 1, wherein the α-olefin of the first low crystalline ethylene/α-olefin copolymer is a butene α-olefin and the α-olefin of the second low crystalline ethylene/α-olefin copolymer is an octene α-olefin.

8. The film of claim 1, wherein the film includes greater than 70% by weight of first and second low crystalline ethylene/α-olefin copolymer.

9. The film of claim 1, wherein, after exposure to damp heat conditions of 85° C. and 85% relative humidity for 1000 hrs, the percent transmittance averages at least 90% over a wavelength range of 400-1100 nm.

10. The film of claim 1, wherein, after exposure to damp heat conditions of 85° C. and 85% relative humidity for 120 hrs, the adhesion of the film is greater than 100 N/cm.

11. A film capable of use in a photovoltaic solar module, comprising:
    a first polyolefin with a DSC peak melting point less than or equal to 50° C.;
    a second polyolefin with a DSC peak melting point greater than 50° C.;
    a silane; and
    one or more cross-linking agents;
    wherein the percent transmittance averages at least 90% over a wavelength range of 400-1100 nm after exposure to damp heat conditions of 85° C. and 85% relative humidity for 1000 hrs.

12. The film of claim 11, wherein at least one of the first and second polyolefins is an ethylene/α-olefin copolymer.

13. The film of claim 11, wherein the silane is an unsaturated alkoxysilane.

14. The film of claim 11, wherein the one or more cross-linking agents are one of a thermal curative and a photo-curative.

15. The film of claim 11, further comprising an additional resin.

16. The film of claim 11, wherein the α-olefin of the first low crystalline ethylene/α-olefin copolymer is a butene α-olefin and the α-olefin of the second low crystalline ethylene/α-olefin copolymer is an octene α-olefin.

17. The film of claim 11, wherein the film includes greater than 70% by weight of first and second low crystalline ethylene/α-olefin copolymer.

18. The film of claim 11, wherein, after exposure to damp heat conditions of 85° C. and 85% relative humidity for 1000 hrs, the percent transmittance averages at least 90% over a wavelength range of 400-1100 nm.

19. The film of claim 11, wherein, after exposure to damp heat conditions of 85° C. and 85% relative humidity for 120 hrs, the adhesion of the film is greater than 100 N/cm.

* * * * *